(12) United States Patent
Unno et al.

(10) Patent No.: US 7,795,612 B2
(45) Date of Patent: Sep. 14, 2010

(54) ORGANIC SEMICONDUCTOR DEVICE, PROCESS FOR PRODUCING THE SAME, AND ORGANIC SEMICONDUCTOR APPARATUS

(75) Inventors: Akira Unno, Kamakura (JP); Naotake Sato, Sagamihara (JP); Hajime Miyazaki, Yokohama (JP); Noriyuki Doi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 376 days.

(21) Appl. No.: 12/003,401

(22) Filed: Dec. 26, 2007

(65) Prior Publication Data
US 2008/0105868 A1   May 8, 2008

Related U.S. Application Data

(62) Division of application No. 10/532,078, filed as application No. PCT/JP2004/015295 on Oct. 8, 2004, now abandoned.

(30) Foreign Application Priority Data

Oct. 9, 2003   (JP)   .............................. 2003-351159
Sep. 10, 2004  (JP)   .............................. 2004-264499

(51) Int. Cl.
      *H01L 51/30* (2006.01)
(52) U.S. Cl. .................. 257/40; 257/E51.007
(58) Field of Classification Search ............... 257/40, 257/E51.001–E51.052; 438/99
See application file for complete search history.

(56) References Cited

U.S. PATENT DOCUMENTS

| | | | |
|---|---|---|---|
| 4,826,901 A | 5/1989 | Ittmann et al. | 324/145 |
| 5,500,537 A | 3/1996 | Tsumura et al. | 257/40 |
| 5,546,889 A | 8/1996 | Wakita et al. | 117/84 |
| 5,556,706 A | 9/1996 | Wakita et al. | 438/421 |

(Continued)

FOREIGN PATENT DOCUMENTS

EP   1 006 152   6/2000

(Continued)

OTHER PUBLICATIONS

A. R. Brown, et al., "A universal relation between conductivity and field-effect mobility in doped amorphous organic semiconductors", Synthetic Metals, vol. 68, 1994, pp. 65-70.

(Continued)

*Primary Examiner*—Matthew W Such
(74) *Attorney, Agent, or Firm*—Fitzpatrick, Cella, Harper & Scinto

(57) ABSTRACT

The present invention provides an organic semiconductor device, which can be produced uniformly on a large substrate, having a high mobility and capable of greatly modulating the drain current by varying the voltage applied to a gate electrode. The present invention provides an organic semiconductor device having at least a substrate, an organic semiconductor, a gate insulating film and conductors, and having electrodes for applying bias, wherein a polymer layer, which is different from the gate insulating film, is provided in contact with the organic semiconductor, and the polymer layer is formed of a copolymer of methyl methacrylate and divinylbenzene, or the like; a process for producing the organic semiconductor device; and an organic semiconductor apparatus using the organic semiconductor device.

3 Claims, 2 Drawing Sheets

U.S. PATENT DOCUMENTS

| | | | |
|---|---|---|---|
| 5,861,198 A * | 1/1999 | Yamaguchi et al. | 428/1.23 |
| 5,912,473 A | 6/1999 | Wakita et al. | 257/40 |
| 5,970,361 A | 10/1999 | Kumomi et al. | 438/409 |
| 6,106,613 A | 8/2000 | Sato et al. | 117/54 |
| 6,143,628 A | 11/2000 | Sato et al. | 438/455 |
| 6,143,629 A | 11/2000 | Sato | 438/455 |
| 6,171,982 B1 | 1/2001 | Sato | 438/795 |
| 6,221,738 B1 | 4/2001 | Sakaguchi et al. | 438/455 |
| 6,252,002 B1 | 6/2001 | Yamada et al. | 525/228 |
| 6,326,640 B1 * | 12/2001 | Shi et al. | 257/40 |
| 6,335,269 B1 | 1/2002 | Sato | 438/509 |
| 6,375,738 B1 | 4/2002 | Sato | 117/89 |
| 6,407,367 B1 | 6/2002 | Ito et al. | 219/390 |
| 6,413,874 B1 | 7/2002 | Sato | 438/714 |
| 6,433,359 B1 * | 8/2002 | Kelley et al. | 257/40 |
| 6,506,665 B1 | 1/2003 | Sato | 438/458 |
| 6,569,748 B1 | 5/2003 | Sakaguchi et al. | 438/455 |
| 6,593,211 B2 | 7/2003 | Sato | 438/455 |
| 6,613,678 B1 | 9/2003 | Sakaguchi et al. | 438/695 |
| 6,639,327 B2 | 10/2003 | Momoi et al. | 257/913 |
| 6,720,572 B1 | 4/2004 | Jackson et al. | 257/40 |
| 6,723,394 B1 * | 4/2004 | Sirringhaus et al. | 428/1.1 |
| 6,783,588 B2 | 8/2004 | Aoto et al. | 117/4 |
| 6,828,214 B2 | 12/2004 | Notsu et al. | 438/455 |
| 6,946,676 B2 | 9/2005 | Kelley et al. | 257/40 |
| 6,992,324 B2 | 1/2006 | Nagayama | 257/40 |
| 7,008,701 B2 | 3/2006 | Notsu et al. | 428/641 |
| 7,029,945 B2 | 4/2006 | Veres et al. | 438/99 |
| 7,098,525 B2 * | 8/2006 | Bai et al. | 257/642 |
| 7,164,183 B2 | 1/2007 | Sakaguchi et al. | 257/499 |
| 7,199,061 B2 | 4/2007 | Choi et al. | 438/738 |
| 7,202,495 B2 | 4/2007 | Unno | 257/40 |
| 7,285,440 B2 | 10/2007 | Dimitrakopoulos et al. | 438/99 |
| 2003/0102471 A1 * | 6/2003 | Kelley et al. | 257/40 |
| 2004/0012017 A1 * | 1/2004 | Nagayama | 257/40 |
| 2004/0012018 A1 | 1/2004 | Tanabe | 257/40 |
| 2004/0161873 A1 * | 8/2004 | Dimitrakopoulos et al. | 438/99 |
| 2004/0231581 A1 | 11/2004 | Aoto et al. | 117/2 |
| 2006/0081880 A1 | 4/2006 | Miyazaki et al. | 257/200 |

FOREIGN PATENT DOCUMENTS

| | | |
|---|---|---|
| EP | 1 385 220 | 1/2004 |
| JP | 3-255669 | 11/1991 |
| JP | 7-206599 | 8/1995 |
| JP | 2000-256527 | 9/2000 |
| JP | 2001-94107 | 4/2001 |
| JP | 2004-55654 | 2/2004 |
| JP | 2004-165427 | 6/2004 |
| WO | 03/041185 | 5/2003 |

OTHER PUBLICATIONS

Y.-Y. Lin, et al., "Stacked Pentacene Layer Organic Thin-Film Transistors with Improved Characteristics", IEEE Electron Device Letters, vol. 18, No. 12, Dec. 1997, pp. 606-608.

M. Yoshida, et al., "Surface Potential Control of an Insulator Layer for the High Performance Organic FET", Synthetic Metals, vol. 137, 2003, pp. 967-968.

* cited by examiner

ORGANIC SEMICONDUCTOR DEVICE, PROCESS FOR PRODUCING THE SAME, AND ORGANIC SEMICONDUCTOR APPARATUS

This application is a divisional of application Ser. No. 10/532,078, which was the National Stage of International Application No. PCT/2004/015295, filed Oct. 8, 2004. The contents of each of the foregoing applications is incorporated herein by reference.

TECHNICAL FIELD

The present invention relates to an organic semiconductor device, a process for producing the same, and an active matrix display apparatus or an organic semiconductor apparatus such as an IC tag, having the organic semiconductor device.

BACKGROUND ART

In recent years, a great progress has been made for an organic thin-film transistor (hereinafter referred to as "organic TFT"). Organic TFTs are advantageously used in that the organic TFTs can be produced at a low temperature as compared with inorganic TFTs, and an inexpensive resin substrate as a flexible substrate can be used. Because of these advantages, organic TFTs are expected to be applied to a low-cost IC technology for a smart card, electronic tag, display, or the like.

A general organic TFT is composed of a substrate, a gate electrode, a gate insulating film, a source electrode, a drain electrode and an organic semiconductor. By changing a voltage applied to the gate electrode (gate voltage, Vg), the quantity of electric charges on the interface between the gate insulating film and the organic semiconductor is made excessive or deficient, and the value of a drain current (Id) flowing among the source electrode, organic semiconductor and drain electrode is changed, whereby the TFT is switched on and off.

As physical values for indicating performance of an organic TFT, a mobility, ON/OFF ratio and gate threshold voltage are used. The mobility is generally calculated from the gradient of the $Id^{1/2}$-Vg curve in a saturation region in which $Id^{1/2}$ and Vg are in a linear relation, and indicates the degree of easiness in allowing a current to flow. The ON/OFF ratio is represented by the intensity ratio of the minimum Id to the maximum Id when changing the Vg. The gate threshold voltage is defined by the X-intercept of a straight line in contact with the $Id^{1/2}$-Vg curve in the saturation region, and indicates the gate voltage at which the TFT is switched on and off.

As target values of characteristics of an organic TFT, values of an amorphous Si TFT used for an existing active matrix liquid crystal display apparatus are assumed. Specifically, the mobility is 0.3 to 1 $cm^2$/Vs, the ON/OFF ratio is $10^6$ or more, and the gate threshold voltage is 1 to 2 V.

Recent researches have revealed that characteristics of an organic TFT are associated with crystallinity of an organic semiconductor. For example, A. R. Brown, D. M. de Leeuw, E. E. Havinga, and A. Pomp, "Synthetic Metals", Vol. 68, pp. 65-70, 1994 discloses that an organic TFT using an amorphous organic semiconductor cannot have a high mobility and a high ON/OFF ratio in combination.

In order to improve characteristics of an organic TFT, various attempts of improving the crystal state and orientation of an organic semiconductor have been made. One example is an attempt of improving crystallinity of an organic semiconductor by placing an underlayer under an organic semiconductor layer. Japanese Patent Application Laid-open No. H07-206599 discloses a method of orienting an organic semiconductor of an oligothiophene compound or the like using a polytetrafluoroethylene (PTFE) oriented film as an underlayer. However, since solid PTFE is slided at a constant pressure to form the PTFE film, it is difficult to produce a substrate with a large area.

Y-Y. Lin, D. J. Gundlach, S. F. Nelson, and T. N. Jackson, "IEEE Electron Devices Letters", Vol. 18, No. 12, pp. 606-608, 1997 discloses a method of obtaining a high-performance organic TFT by coating the surface of a gate insulating film with octadecyltrichlorosilane as a vertically oriented film and then forming two pentacene-deposited film layers. However, this method can be applied to only a surface having a basic functional group such as silicon oxide, and is therefore less versatile.

Japanese Patent Application Laid-open No. 2001-9410.7 discloses an organic semiconductor device produced by a method in which a fluorine polymer layer with a film thickness of 0.3 to 10 nm is formed on the surface of a gate insulating film by dipping, and a crystalline organic semiconductor is formed thereon. However, it is considered that, in this method, crystals of the organic semiconductor are not sufficiently oriented because the crystals have two peaks in the wide-angle X-ray spectrum, and the device does not have satisfactory characteristics.

U.S. Pat. No. 6,433,359 discloses a method of improving the mobility of an organic TFT by treating the surface of an alumina gate insulating film with alkyl phosphate. Since there are limitations to the gate insulating film to which this method can be applied, the method is also less versatile.

M. Yoshida, S. Uemura, T. Kodzasa, T. Kamata, M. Matsuzawa, and T. Kawai, "Synthetic Metals", Vol. 137, pp. 967-968, 2003 discloses a method of improving the growth of crystals of an organic semiconductor by forming a polymer layer of polymethyl methacrylate or the like on an inorganic gate insulating film. However, an organic TFT obtained by this method has characteristics that are inferior and insatisfactory for practical use.

International Publication Number WO 03/041185 A2 discloses an organic TFT comprising a substantially nonfluorinated polymeric layer having a thickness less than about 400 angstrom interposed between a gate dielectric and an organic semiconductor layer.

DISCLOSURE OF THE INVENTION

The present invention provides a device structure of a high-performance organic TFT and a process for producing the high-performance organic TFT at a low cost. The present invention also provides an organic semiconductor apparatus using the organic semiconductor device.

Specifically, the present invention provides an organic semiconductor device having at least a substrate, an organic semiconductor, a gate insulating film and a conductor, and further having an electrode for applying bias, wherein a polymer layer, which is different from the gate insulating film, is provided in contact with the organic semiconductor, and the polymer layer is a copolymer of methyl methacrylate and divinylbenzene or a polymer represented by the formula (1) or (2):

wherein $R^{11}$ represents a hydrogen atom or an alkyl group, $R^{12}$ represents a naphthyl group which may be substituted, a carbazoyl group which may be substituted, or a biphenyl group which may be substituted, and n denotes polymerization degree, or

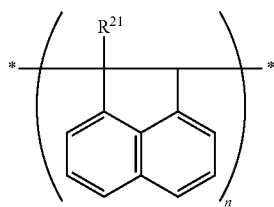

(2)

wherein $R^{21}$ represents a hydrogen atom or an alkyl group, the aromatic ring may be substituted, and n denotes polymerization degree; a process for producing the organic semiconductor device; and an organic semiconductor apparatus using the organic semiconductor device. Here, the conductor generally refers to a gate electrode, a source electrode, or a drain electrode. In this case, the organic semiconductor device of the present invention can be used as a field effect transistor. For example, polymerization degree n in the formula (1) and (2) is a number in the range of 10 to 1000000.

As the process for producing the organic semiconductor device, there is a process for producing the organic semiconductor device, including at least a step of forming an insulating film on a substrate having a surface, at least a part of the surface being conductive, a step of forming a polymer layer composed of a copolymer of methyl methacrylate and divinylbenzene or a polymer represented by the formula (1) or (2) on the insulating film, and a step of forming an organic semiconductor layer on the polymer layer;

and a process for producing the organic semiconductor device, including at least a step of forming a polymer layer composed of a copolymer of methyl methacrylate and divinylbenzene or a polymer represented by the formula (1) or (2) on a substrate, a step of forming an organic semiconductor layer on the polymer layer, and a step of forming an insulating film on the organic semiconductor layer.

In the former process, the conductive part which is a part of the substrate can be a gate electrode. In the latter process, a gate electrode can be formed on the insulating film. In both cases, at least one pair of electrodes apart from each other (in general, source/drain electrodes) can be formed in suitable positions. The order of formation of the constituents varies depending on various forms of the organic semiconductor device described below.

A preferable embodiment of the present invention can provide an organic semiconductor device, which can be produced uniformly on a substrate with a large area, having a high mobility and capable of largely modulating the drain current by the voltage applied to a gate electrode.

Another embodiment of the present invention can provide an organic semiconductor device that is operated in a stable manner, can be driven at a low voltage, has a long life expectancy, and can be produced in a simple process.

Still another embodiment of the present invention can provide an active matrix display apparatus using the organic semiconductor device or an organic semiconductor apparatus using the organic semiconductor device as an IC card electronic tag.

BEST MODE FOR CARRYING OUT THE INVENTION

Figure 1A:
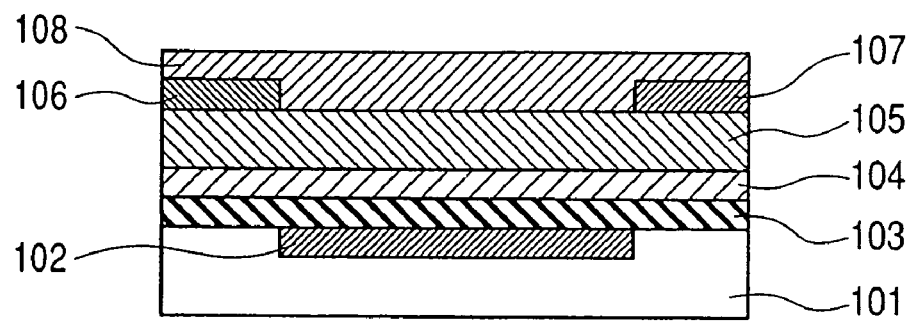
FIGS. 1A, 1B, 1C, 1D and 1E are schematically sectional views showing embodiments of the organic semiconductor device of the present invention.

The present invention will be described in detail below.

First, a structure of the organic semiconductor device used in the present invention will be described.

Examples (a) to (e) of the structure of the organic semiconductor device used in the present invention are shown in FIGS. 1A to 1E. In the figures, reference numeral 101 denotes a substrate, reference numeral 102 denotes a gate electrode, reference numeral 103 denotes a gate insulating film, reference numeral 104 denotes a polymer layer, reference numeral 105 denotes an organic semiconductor, reference numeral 106 denotes a source electrode, reference numeral 107 denotes a drain electrode, and reference numeral 108 denotes a protective layer. The protective layer is optionally provided, but may be omitted.

(a) a structure in which the substrate, the gate electrode, the gate insulating film, the polymer layer, the organic semiconductor, the source/drain electrodes and the protective layer are provided in this order (see FIG. 1A).

Figure 1B:
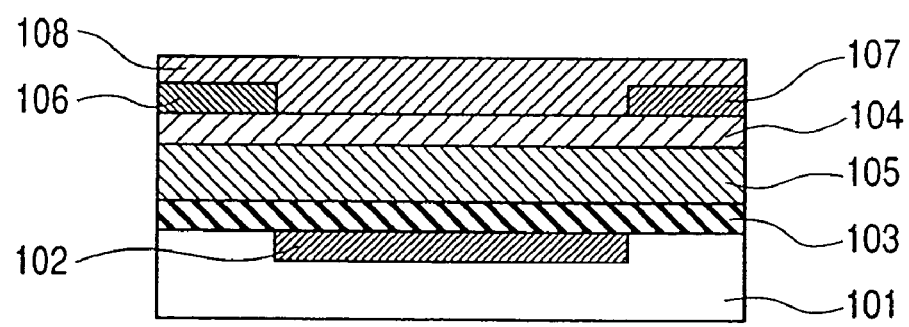

(b) a structure in which the substrate, the gate electrode, the gate insulating film, the organic semiconductor, the polymer layer, the source/drain electrodes and the protective layer are provided in this order (see FIG. 1B).

Figure 1C:
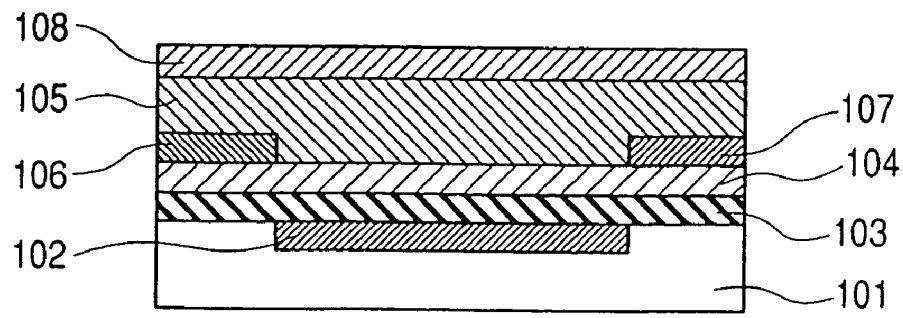

(c) a structure in which the substrate, the gate electrode, the gate insulating film, the polymer layer, the source/drain electrodes, the organic semiconductor and the protective layer are provided in this order (see FIG. 1C).

Figure 1D:
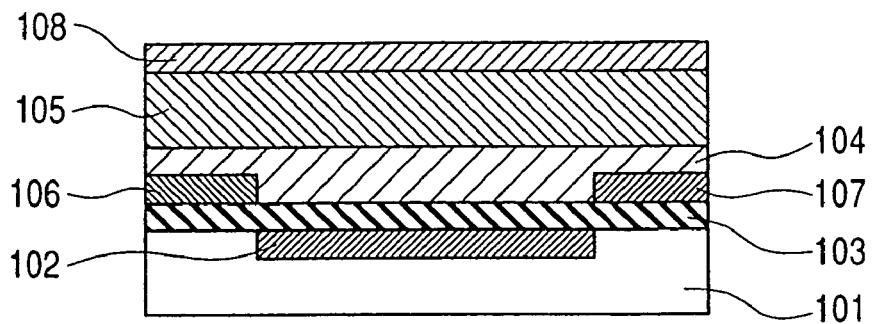

(d) a structure in which the substrate, the gate electrode, the gate insulating film, the source/drain electrodes, the polymer layer, the organic semiconductor and the protective layer are provided in this order (see FIG. 1D).

Figure 1E:
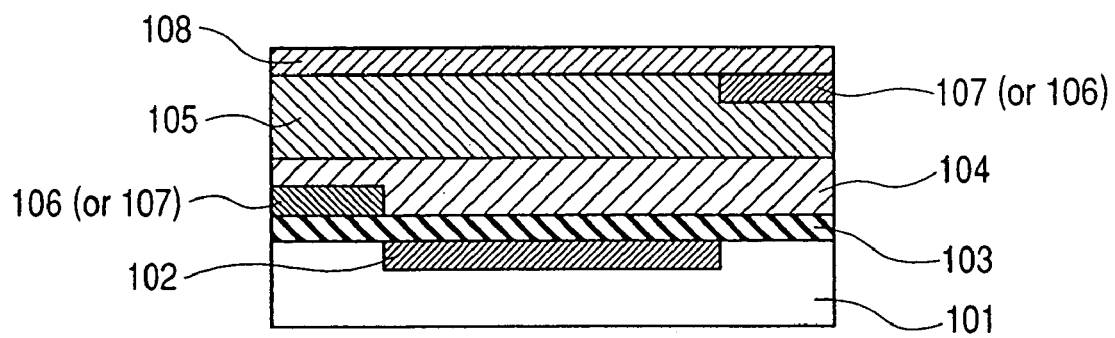

(e) a structure in which the substrate, the gate electrode, the gate insulating film, one of the source/drain electrodes, the polymer layer, the organic semiconductor, the other of the source/drain electrodes, and the protective layer are provided in this order (see FIG. 1E).

However, the above (a) to (e) are examples but the order of formation and configuration are not limited by the above (a) to (e). Of course, it is considered that the organic semiconductor layer is preferably formed after the polymer layer is formed. This is presumably because such an order of formation ensures the polymer layer to function as a layer for controlling the orientation of the organic semiconductor.

Examples of such a structure with a preferable configuration include:

a structure having the gate electrode, the gate insulating film, the polymer layer, the organic semiconductor and the source electrode/drain electrode on the substrate in this order, a structure having the gate electrode, the gate insulating film, the polymer layer, the source electrode/drain electrode and the organic semiconductor on the substrate in this order, a structure having the gate electrode, the gate insulating film, the source electrode/drain electrode, the polymer layer and the organic semiconductor on the substrate in this order, a structure having the source electrode/drain electrode, the polymer layer, the organic semiconductor, the gate insulating film and the gate electrode on the substrate in this order, a structure having the polymer layer, the source electrode/drain electrode, the organic semiconductor, the gate insulating film and the gate electrode the substrate in this order, and a structure having the polymer layer, the organic semiconductor, the source electrode/drain electrode, the gate insulating film and the gate electrode on the substrate in this order.

Further, the organic semiconductor device having a structure having the gate electrode, the gate insulating film, one of the source/drain electrodes, the organic semiconductor, and the other of source/drain electrodes on the substrate in that order, wherein a polymer layer is in contact with the organic semiconductor, and a structure having one of the source/drain electrodes, the organic semiconductor, the other of source/drain electrodes, a gate insulating film and the gate electrode on the substrate in that order, with a polymer layer in contact with the organic semiconductor are within the scope of the present invention, these structures also preferably have a configuration in which the organic semiconductor is formed on the polymer layer after forming the polymer layer.

Next, the organic semiconductor device of the present invention and a process for producing the same will be described.

The material for the substrate used in the present invention can be selected from the group consisting of various organic and inorganic materials. Specific examples of such materials include inorganic materials such as silicon, aluminum, glass and baked alumina; organic materials such as polyethylene terephthalate, polyethylene naphthalate, polyimide, polyethylene, polypropylene, polyether ether ketone, polysulfone and polyphenylene sulfide; and composite materials such as an organic material reinforced with a glass fiber.

The material for the gate electrode used in the present invention is selected from the group consisting of conductive materials. Specific examples of such materials include metallic materials such as gold, platinum, copper, silver, palladium, chromium, molybdenum, titanium, nickel and aluminum; nonmetallic inorganic materials such as tin oxide, indium oxide and indium tin oxide; organic materials such as polythiophene and polyaniline; and carbon materials. As a metallic material, an alloy may also be used. When the conductive material is used as a substrate, the substrate may also be used as a gate electrode.

Examples of the material for the gate insulating film used in the present invention include inorganic materials such as silicon oxide, silicon nitride, alumina and tantalum oxide; and organic materials such as polymethyl methacrylate, polyimide, poly(p-xylene), polychloropyrene, polyethylene terephthalate, polyoxymethylene, silsesquioxane, polyvinyl chloride, polyvinylidene fluoride, cyanoethyl pullulan, polysulfone and polycarbonate.

The polymer layer used in the present invention is a copolymer of methyl methacrylate and divinylbenzene, or a compound represented by the formula (1) or (2).

When the polymer layer is a copolymer of methyl methacrylate and divinylbenzene, the copolymerization ratio of methyl methacrylate (A) to divinylbenzene (B) is a monomer unit ratio of A:B=1:0.001 to 0.04, and preferably 1:0.001 to 0.02. The film thickness of the polymer layer is preferably 5 nm or more and 30 nm or less. The surface roughness (Ra) of the gate electrode in contact with the polymer layer is preferably 5 nm or less.

When the polymer layer is composed of a compound represented by the formula (1) or (2), $R^{11}$ and $R^{12}$ are independently a hydrogen atom or an alkyl group. Specific examples of the alkyl group include methyl group, ethyl group, n-propyl group, isopropyl group, n-butyl group, sec-butyl group, t-butyl group, n-pentyl group and n-hexyl group.

The compound represented by the formula (1) or (2) may have a substituent on the aromatic ring. Examples of the substituent include alkyl groups such as methyl group, ethyl group, n-propyl group, isopropyl group, n-butyl group, sec-butyl group, t-butyl group, n-pentyl group and n-hexyl group; aryl groups such as a phenyl group and p-tolyl group; alkoxy groups such as methoxy group and ethoxy group; and halogen atoms such as fluorine atom, chlorine atom, and bromine atom. The compound may have two or more of the substituents. The film thickness of the polymer layer composed of a compound represented by the formula (1) or (2) is preferably 100 nm or less, more preferably 50 nm or less, and still more preferably 30 nm or less. The smaller the film thickness, the better. This is presumably because the function of the polymer layer as an insulating film is not necessarily sufficient, and the effect of the induced field is smaller as the field is distanced from the interface between the gate insulating film and the polymer layer. On the other hand, theoretically, the thickness of the polymer layer can be reduced to a monomolecular level. Of course, it is difficult to produce an extremely thin film with an uniform thickness in many cases, the film thickness of the polymer layer is preferably 10 nm or more, more preferably 15 nm or more, and still more preferably 20 nm or more, from the viewpoint of easiness in forming a film.

The polymer layer of the present invention is formed by dissolving a polymer in an organic solvent and coating with the solution by spin coating, spray coating, or dip coating. There are no specific limitations to the organic solvent used, insofar as a polymer can be dissolved therein. Specific examples of the organic solvent include hydrocarbons such as hexane, cyclohexane, heptane and octane; aromatic hydrocarbons such as toluene, xylene and ethylbenzene; halogenated solvents such as dichloromethane, chloroform, carbon tetrachloride, 1-chlorobutane, chlorobenzene and dichlorobenzene; organic acid esters such as ethyl acetate, propyl acetate, butyl acetate and pentyl acetate; ethers such as diethyl ether, diisopropyl ether, dibutyl ether, anisole and dioxane; ketones such as acetone, methyl ethyl ketone, methyl isobutyl ketone and cyclohexanone; nitrogen-containing organic solvents such as nitrobenzene, acetonitrile, N,N-dimethylformamide and N-methyl-2-pyrrolidone; and sulfur-containing organic solvents such as carbon disulfide and dimethylsulfoxide. Two or more of these organic solvents may be used.

The organic semiconductor material used in the present invention includes a crystalline material having a low molecular weight. Specific examples of such a material include pentacene, tetracene, a phthalocyanine compound, a porphyrin compound, and oligothiophene. Pentacene is preferable. However, since the polymer layer accelerates the crystal growth of the organic semiconductor, use of a crystalline material having a low molecular weight other than pentacene is also effective. Instead of a vapor deposition method, a method of forming a film by dissolving the material in a solvent, coating the solution, and heating it may be also employed. However, when the coating method is used, it is essential to select a solvent suitable for a material for the organic semiconductor and for dissolving the polymer layer with difficulty. Therefore, the vapor deposition method which does not require such a selection is more preferable.

The material for the source/drain electrodes used in the present invention can be selected from the group consisting of the same conductive materials as in the case of the material for the gate electrode described above.

The protective layer used in the present invention is formed in order to prevent deterioration of characteristics of an organic TFT. Although there are no specific limitations to the material for the protective layer, a composite material of an organic material such as an epoxy resin or silicone resin and an inorganic compound such as glass or aluminum is generally used. The protective layer may be omitted.

The gate electrode, gate insulating film, source/drain electrode and organic semiconductor used in the present invention, other than the polymer layer, are formed by a known method. Specific examples of such a method include vacuum vapor deposition, spattering, plasma CVD, spin coating, dip coating, spray coating and printing. Patterning using a combination of existing photolithography and dry etching or wet etching may also be carried out.

Next, the present invention relates to an organic semiconductor apparatus, wherein the apparatus employs the organic semiconductor device as an IC information electronic tag.

An electronic tag smart card as an example of the organic semiconductor apparatus of the present invention using the IC information electronic tag will be described. Tagging an article by bar codes or symbols to make optical characters easily recognized has been utilized for a long time to identify and detect a product catalogue, baggage, chit made of paper, or another movable article which is easily left behind or lost. Such an optically perceived tag must be maintained to be visible for identification. However, the tag easily becomes unreadable due to scars on the surface or other damages. In order to improve reliability of detection, a method of using an electronic tag based on the radio frequency has been attempted. Typically, such a tag is provided with a semiconductor memory for storing data, a processing logic and an antenna for broadcasting the data, which are all embedded in a container of a heat-curable resin such as an epoxy resin, a thermoplastic resin, or another suitable plastic material.

The data storage capacity is typically in the range of several bits to several kilobits, and more typically 64 bits. The tag can comprise a read-only memory (ROM), electrically programmable or erasable ROM (EPROM or EEPROM) or flash memory. Power is supplied to the electronic tag by a long-life small battery, a photovoltaic power, a thermal converter, an induced power converter depending on the electromagnetic energy added from outside, or another suitable power source. Formation of the electronic tag with a circuit using the organic semiconductor device simplifies the process for producing the tag and makes the tag available at a low cost.

Next, the present invention relates to an active matrix display apparatus, wherein using the organic semiconductor device as an active device.

In the active matrix liquid crystal display apparatus, each pixel constituting the display part is provided with an active matrix device through which voltage is applied to the liquid crystals. The apparatus is driven in the following manner. Intersections of n×m matrix wires consisting of n rows of scanning lines and m columns of signal lines are provided with active matrix devices such as TFTs. The gate electrodes, drain electrodes and source electrodes of the TFTs are respectively connected to the scanning lines, signal lines, and pixel electrodes. The address signal is supplied to the scanning lines, and the display signal is supplied to the signal lines. These signals operate the liquid crystals on the pixel electrodes via the TFT switch controlled by the address signal superimposed by the ON/OFF signals. Use of the organic semiconductor device as the switching device simplifies the process for producing the apparatus and makes the apparatus available at a low cost.

Synthetic Example 1

An example of synthesis of a copolymer of methyl methacrylate and divinylbenzene used in the organic semiconductor device of the present invention is shown in the following reaction formula (1).

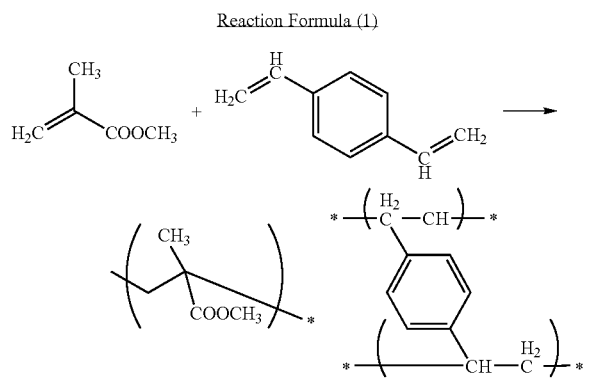

Reaction Formula (1)

A mixed solution of methyl methacrylate, divinylbenzene and a polymerization initiator was dropped in a reflux of toluene at a reflux temperature of toluene (110° C. to 120° C.). The mixture was then cooled to 80° C., and maintained at that temperature for three hours. After allowing to be cooled, the mixture was reprecipitated in methanol. After decanting the supernatant and washing the precipitate with methanol, the precipitate was filtered. The filtrate was dried by heating under reduced pressure to obtain the target polymer.

From the results of analyzing the $^1$H-NMR spectrum of the resulting polymer (using a $^1$H-NMR analyzer manufactured by JEOL Ltd., resonant frequency: 400 MHz, solvent: $CDCl_3$, external reference material: TMS, measured at room temperature), the copolymerization ratio of methyl methacrylate (A) to divinylbenezene (B) (monomer unit ratio (A:B)) was 1:0.011.

A copolymer with a copolymerization rate (B/A) of 0.001 to 0.05 was produced using the above method.

Example 1

A polyimide substrate was used in this example. Upilon (trade name) manufactured by Ube Industries, Ltd. with a thickness of 125 µm was used as the substrate.

Next, copper was formed as a film by sputtering, and the film was patterned by photolithography to produce a gate electrode wire. Further, a coating-type insulating film composed of methylsilsesquioxane was formed thereon, and baked at 230° C. to form a substrate for a semiconductor.

The polyimide substrate was washed in the following manner. A step of ultrasonically washing the polyimide substrate in acetone with a purity of 99% or more for one minute and then a step of washing the substrate ultrasonically in pure water for five minutes were carried out twice, respectively. After the washing, the pure water was blowed away by an $N_2$ gas. Then, the substrate was irradiated with ultraviolet (UV) lights at wavelengths of 184.9 nm and 253.7 nm at an intensity of 100 mW for an irradiation time of 20 seconds to remove the organic contaminant.

A polymer layer was formed using the copolymer with a copolymerization ratio of 1:0.011 produced in Synthetic Example 1. The film was formed by spin coating in which a 0.1% solution of the copolymer diluted with xylene was maintained at 500 rpm for ten seconds, and then the solution was formed as a film at 3,000 rpm. The film thickness was 20 nm.

Then, an electrode was formed by screen printing. A colloidal silver conductive paste manufactured by Nippon Paint Co., Ltd. was used for printing. The electrode was baked at 200° C. after the printing.

Next, a method for producing a pentacene-deposited film used for the organic semiconductor device of the present invention will be described.

A commercially available powder of pentacene was purified by sublimation and vacuum deposited. The pentacene-deposited film was produced under the following conditions. The ultimate vacuum in the vapor deposition apparatus chamber was $3 \times 10^{-4}$ Pa to $5 \times 10^{-4}$ Pa. The pentacene powder was put in a K-cell. A substrate was placed at a position of about 20 cm above a boat. The cell was heated to about 260° C. to sublimate the pentacene, which was deposited on the surface of the substrate. The substrate was heated to 125° C. using a heater board. A crystal oscillator was placed almost level with the substrate on the heater board. The film thickness and the vapor deposition speed were calculated from the change in the resonant frequency of the oscillator. The thickness of the pentacene film was adjusted to 100 nm.

For evaluation of characteristics, the mobility as transistor characteristics was calculated by the following calculating formula (1) using an HP parameter analyzer (HP4156C).

$$Id = \tfrac{1}{2} \times (L/W) \times Ci \times \mu \times (Vg - Vth)^2 \qquad \text{Formula (1)}$$

Id: Drain current (A)
L: Gate length (cm)
W: Gate width (cm)
Ci: Capacitance per unit area (C/cm$^2$)
μ: Mobility (cm$^2$/Vs)
Vg: Gate voltage (V)
Vth: Gate threshold voltage (V)

When forming the polymer layer as a film, the mobility was 1.12 cm$^2$/Vs, the ON/OFF ratio was 2.20E+08, and the Vth was −5 V.

Comparative Example 1

A transistor was produced in the same manner as in Example 1. However, a polymer layer film was not formed. In this case, the transistor had a mobility of 0.060 m$^2$/Vs, an ON/OFF ratio of 2.5E+06, and a Vth of −15 V.

Examples 2 to 17

Each transistor was produced in the same manner as in Example 1, while the copolymerization rate (B/A) of the polymer layer on the insulating film was changed in the range of 0.001 to 0.04. The results are shown in Table 1.

TABLE 1

Comparison of copolymerization ratio of polymer layer with transistor characteristics (Film thickness: 20 nm)

| Example | Copolymerization rate | Condition of coating | Mobility (cm$^2$/Vs) | ON/OFF ratio | Vth (V) |
|---|---|---|---|---|---|
| 1 | 0.011 | Good | 1.12 | 2.20E+08 | −5 |
| 2 | 0.001 | Good | 0.65 | 2.90E+08 | −12 |
| 3 | 0.002 | Good | 0.68 | 3.20E+08 | −15 |
| 4 | 0.003 | Good | 0.76 | 5.20E+08 | −16 |
| 5 | 0.004 | Good | 0.83 | 4.80E+08 | −18 |
| 6 | 0.005 | Good | 0.75 | 5.10E+08 | −19 |
| 7 | 0.006 | Good | 0.69 | 6.20E+08 | −15 |
| 8 | 0.007 | Good | 0.89 | 8.20E+08 | −12 |
| 9 | 0.008 | Good | 1.05 | 7.70E+08 | −19 |
| 10 | 0.009 | Good | 1.12 | 9.25E+08 | −21 |
| 11 | 0.01 | Good | 1.35 | 1.23E+08 | −22 |
| 12 | 0.015 | Good | 1.2 | 1.22E+08 | −23 |
| 13 | 0.02 | Good | 1.02 | 1.02E+08 | −15 |
| 14 | 0.025 | Good | 0.6 | 6.50E+07 | −12 |
| 15 | 0.03 | Good | 0.6 | 3.20E+07 | −12 |
| 16 | 0.035 | Good | 0.3 | 1.20E+07 | −6 |
| 17 | 0.04 | Good | 0.32 | 9.50E+06 | −5 |

Comparative Examples 2 to 4

Each transistor was produced in the same manner as in Example 1. However, the copolymerization rate (B/A) of the polymer layer on the insulating film was adjusted to 0.045 (Comparative Example 2), 0.050 (Comparative Example 3) or 0 (PMMA homopolymer) (Comparative Example 4). The results are shown in Table 2.

TABLE 2

| Comparative Example | Copolymerization rate | Condition of coating | Mobility (cm$^2$/Vs) | ON/OFF ratio | Vth (V) |
|---|---|---|---|---|---|
| 1 | None | | 0.06 | 2.50E+06 | −15 |
| 2 | 0.045 | Coating not formed | 0.02 | 2.10E+05 | −12 |
| 3 | 0.05 | Coating not formed | 0.02 | 5.50E+04 | −13 |
| 4 | 0 | Good | 0.06 | 5.40E+05 | −18 |

(Note)
The copolymerization rate indicates the monomer unit rate (B/A) of divinylbenzene (B) to one unit of methyl methacrylate (A).

It was found that, when the copolymerization rate was 0.001 to 0.040, a transistor with good characteristics was obtained. When the copolymerization rate was 0.001 to 0.02, a transistor with particularly good characteristics was obtained. It was also found that, when the copolymerization rate was more than 0.40, film characteristics of the polymer layer were remarkably inferior, and characteristics of the transistor were also inferior. When the polymer layer was composed only of polymethyl methacrylate (copolymerization rate: 0), film characteristics were good, but characteristics of the transistor were not good.

Examples 18 to 28

Next, copper foil was bonded to an epoxy substrate reinforced with a glass fiber, and the foil was then patterned by photolithography to form a gate electrode. Further, Ta$_2$O$_5$ was sputtered to form an insulating film with a surface roughness of 3 nm, which was used as a substrate. The insulating film was coated with the copolymer of methyl methacrylate/divinylbenzene used in Example 1 with the copolymerization ratio (monomer unit ratio) adjusted to a constant (1:0.01) to produce a transistor in the same manner as in Example 1. The thickness of the polymer layer and characteristics of the transistor were examined. The results are shown in Table 3.

TABLE 3

Relation between film thickness and mobility

| Example | Film thickness (nm) | Mobility (cm$^2$/Vs) | ON/OFF ratio | Vth (V) |
|---|---|---|---|---|
| 18 | 5 | 0.5 | 1.00E+07 | 12 |
| 19 | 7.5 | 0.65 | 1.22E+08 | −5 |
| 20 | 10 | 0.7 | 1.35E+07 | −12 |
| 21 | 12.5 | 0.85 | 2.25E+07 | −23 |
| 22 | 15 | 1.03 | 3.21E+07 | −24 |
| 23 | 17.5 | 1.25 | 2.50E+07 | −30 |
| 24 | 20 | 1.5 | 8.52E+07 | −21 |
| 25 | 22.5 | 0.88 | 3.25E+06 | −17 |
| 26 | 25 | 0.7 | 2.31E+06 | −21 |
| 27 | 27.5 | 0.45 | 2.60E+06 | −26 |
| 28 | 30 | 0.4 | 5.21E+06 | −30 |

Reference Examples 1 to 4

Each transistor was produced in the same manner as in Example 18. However, the film thickness of the polymer layer was adjusted to 1 nm or 35 nm or more. The results are shown in Table 4.

TABLE 4

Reference Example

| Reference Example | Film thickness (nm) | Mobility (cm²/Vs) | ON/OFF ratio | Vth (V) |
|---|---|---|---|---|
| 1 | 35 | 0.2 | 2.31E+04 | −10 |
| 2 | 40 | 0.02 | 4.60E+03 | −2 |
| 3 | 45 | 0.03 | 3.24E+03 | −1 |
| 4 | 1 | 0.1 | 1.00E+03 | 24 |

From Tables 3 and 4, when the film thickness of the polymer layer was 5 to 30 nm, characteristics of the transistor were good. In particular, when the film thickness was 5 nm to 20 nm, both the mobility and the ON/OFF ratio were high.

Examples 29 to 41

Glass was used as a substrate. Further, aluminum was used as a gate electrode, which was patterned in the same process as in Example 1. $Al_2O_3$ was then sputtered to form an insulating film. The surface roughness of the insulating film was changed by changing the substrate temperature or sputtering speed. Then, a polymer layer was formed in the same manner as in Example 1. The relation between the surface roughness of the insulating film and the polymer layer was examined. The results are shown in Table 5. In this case, the surface roughness was observed by AFM, and the surface was visually observed to judge that the condition of the surface is "good (not rough)" or "rough".

TABLE 5

Relation between gate insulating film surface roughness and polymer layer

| Example | Gate insulating film surface roughness Ra (nm) | Thickness of polymer layer (nm) | Condition of polymer layer surface | Mobility (cm²/Vs) | ON/OFF ratio | Vth (V) |
|---|---|---|---|---|---|---|
| 29 | 0.1 | 20 | Good | 1.2 | 2.60E+07 | −12 |
| 30 | 0.3 | 20 | Good | 0.98 | 6.30E+08 | −25 |
| 31 | 0.5 | 20 | Good | 1.32 | 2.30E+08 | −16 |
| 32 | 1 | 20 | Good | 1.25 | 3.20E+08 | −16 |
| 33 | 2 | 20 | Good | 1.52 | 1.20E+08 | −18 |
| 34 | 2.3 | 20 | Good | 1.32 | 3.20E+08 | −19 |
| 35 | 2.5 | 20 | Good | 1.22 | 2.20E+08 | −21 |
| 36 | 3.2 | 20 | Good | 0.98 | 1.90E+08 | −12 |
| 37 | 3.5 | 20 | Good | 0.78 | 5.60E+07 | −21 |
| 38 | 4.1 | 20 | Good | 0.65 | 8.60E+07 | −19 |
| 39 | 4.5 | 20 | Good | 0.67 | 5.60E+07 | −18 |
| 40 | 4.7 | 20 | Good | 0.39 | 3.20E+07 | −15 |
| 41 | 5 | 20 | Good | 0.54 | 1.62E+06 | −12 |

Reference Examples 5 to 9

Each transistor was produced in the same manner as in Example 29. However, the surface roughness of the gate insulating film was adjusted to 5.2 nm or more. Characteristics of the transistors are shown in Table 6.

TABLE 6

Reference Example

| Reference Example | Surface roughness of gate insulating film Ra (nm) | Thickness of polymer layer (nm) | Condition of polymer layer surface | Mobility (cm²/Vs) | ON/OFF ratio | Vth (V) |
|---|---|---|---|---|---|---|
| 5 | 5.2 | 20 | Rough | 0.21 | 1.85E+05 | −14 |
| 6 | 5.7 | 20 | Rough | 0.12 | 8.56E+05 | −13 |
| 7 | 6.2 | 20 | Rough | 0.03 | 2.30E+03 | −6 |
| 8 | 7 | 20 | Rough | 0.04 | 1.30E+03 | −2 |
| 9 | 8.3 | 20 | Rough | 0.06 | 9.56E+02 | 3 |

From Tables 5 and 6, when the surface roughness of the gate insulating film was 5 nm or less, characteristics of the transistor were particularly good.

Examples 42 to 48

A high-doped silicon substrate having a 500 nm-thick silicon oxide film was prepared. The silicon substrate was also used as a gate electrode, and the silicon oxide film was used as a gate insulating film.

The silicon substrate was immersed in acetone with a purity of 99% or more and ultrasonically washed for one minute. Then, the substrate was immersed in pure water and ultrasonically washed for one minute. After the washing, the pure water remaining on the surface was blowed away using a nitrogen gas.

A 1.0 wt % solution of poly(1-vinylnaphthalene) manufactured by Aldrich Co. (number average molecular weight: about 100,000) in p-xylene was prepared. The previously prepared substrate was coated with the solution by spin coating (maintaining at 500 rpm, and then forming a film at 3,000 rpm). The coating was baked by heating on a hot plate at 150° C. for five minutes. In this case, the film thickness was 22 nm.

Next, pentacene was formed as a film by vacuum vapor deposition. During the vapor deposition, the previously prepared silicon substrate with the polymer layer formed thereon was heated to 70° C. The film thickness of pentacene was adjusted to 50 nm.

A source electrode and a drain electrode were formed on the pentacene film using gold by vacuum vapor deposition. The gate length was 40 to 50 μm, and the gate width was 3 mm.

Finally, a protective layer was formed by sealing with silicone grease manufactured by Dow Corning Asia Corp. and a glass substrate.

The mobility was calculated by the calculating formula (1) using an HP parameter analyzer (HP4156C). The mobility, ON/OFF ratio and gate threshold voltage are shown in Table 7.

An organic TFT using poly(2-vinylnaphthalene) (manufactured by Aldrich Co., weight average molecular weight: 175,000), poly(N-vinylcarbazole) (manufactured by Acros, weight average molecular weight: about 90,000), poly(4-vinylbiphenyl) (manufactured by Aldrich Co., weight average molecular weight: about 115,000) or polyacenaphthylene (manufactured by Aldrich Co., weight average molecular weight: about 5,000 to 10,000) as a polymer layer was produced in the same manner (Examples 42 to 46). An organic TFT using poly[2-(2-naphthyl)propene] or poly[2-(4-biphenyl)propene] prepared by a known method as a polymer layer was also produced in the same manner (Examples 47 and 48). For comparison, an organic TFT not having a polymer layer was also produced in the same manner (Comparative Example 5). The mobility, ON/OFF ratio and gate threshold voltage are shown in Table 7.

All of the organic TFTs having a polymer layer exhibited performance higher than that of the organic TFT not having a polymer layer.

face processor power source: UVE-110-1H, high-output low-pressure mercury lamp: SUV110GS-36) for 20 minutes to remove the organic contaminant.

TABLE 7

Polymer layer material and TFT performance 2

| | Polymer layer | Type of solvent | Concentration | Film thickness of polymer layer | Mobility | ON/OFF ratio | Gate threshold voltage |
|---|---|---|---|---|---|---|---|
| Example | | | | | | | |
| 42 | Poly(1-vinylnaphthalene) | p-Xylene | 1.0 wt % | 20 nm | 0.86 cm$^2$/Vs | 4.3 × 10$^6$ | −16 V |
| 43 | Poly(2-vinylnaphthalene) | Toluene | 0.8 wt % | 23 nm | 0.94 cm$^2$/Vs | 4.3 × 10$^6$ | −15 V |
| 44 | Poly(N-vinylcarbazole) | Toluene | 0.6 wt % | 24 nm | 1.36 cm$^2$/Vs | 1.8 × 10$^4$ | −19 V |
| 45 | Poly(4-biphenyl) | Toluene | 0.5 wt % | 25 nm | 1.10 cm$^2$/Vs | 2.7 × 10$^6$ | −18 V |
| 46 | Polyacenaphthylene | Chloroform/p-xylene mixed solvent | 1.0 wt % | 75 nm | 0.84 cm$^2$/Vs | 6.3 × 10$^6$ | −18 V |
| 47 | Poly[2-(2-naphthyl)propene] | toluene | 0.3 wt % | 18 nm | 0.54 cm$^2$/Vs | 2.2 × 10$^6$ | −20 V |
| 48 | Poly[2-(4-biphenyl)propene] | toluene | 0.3 wt % | 16 nm | 0.71 cm$^2$/Vs | 4.4 × 10$^6$ | −19 V |
| Comparative Example | | | | | | | |
| 5 | None | — | — | — | 0.37 cm$^2$/Vs | 7.2 × 10$^2$ | −12 V |

Examples 49 to 53

The same operation as in Example 42 was carried out to produce an organic TFT, except for using a solution of 0.6 wt. % to 3.2 wt. % poly(2-vinylnaphthalene) (manufactured by Aldrich Co., weight average molecular weight: 175,000) in toluene. In this case, the film thickness of the polymer layer was 15 nm to 100 nm. The mobility, ON/OFF ratio and gate threshold voltage are shown in Table 8.

TABLE 8

Polymer layer film thickness and TFT performance

| Example | Concentration | Film thickness of polymer layer | Mobility | ON/OFF ratio | Gate threshold voltage |
|---|---|---|---|---|---|
| 49 | 0.6 wt % | 15 nm | 0.40 cm$^2$/Vs | 4.9 × 10$^4$ | −14 V |
| 50 | 0.8 wt % | 20 nm | 0.86 cm$^2$/Vs | 1.6 × 10$^6$ | −17 V |
| 51 | 1.2 wt % | 30 nm | 0.82 cm$^2$/Vs | 5.1 × 10$^6$ | −19 V |
| 52 | 1.6 wt % | 44 nm | 0.70 cm$^2$/Vs | 7.0 × 10$^6$ | −26 V |
| 53 | 3.2 wt % | 100 nm | 0.45 cm$^2$/Vs | 4.9 × 10$^6$ | −24 V |

Examples 54 and 55

A high-doped silicon substrate having a 500 nm-thick silicon oxide film was immersed in acetone with a purity of 99% or more and ultrasonically washed for one minute. Then, the substrate was immersed in pure water and ultrasonically washed for one minute. After the washing, the pure water remaining on the surface was blowed away using a nitrogen gas.

Here, a source electrode and a drain electrode were formed by screen printing using a silver paste manufactured by Taiyo Ink Mfg. Co., Ltd. The electrodes were baked in a clean oven at 150° C. for one hour. In this case, the gate length was 40 to 50 μm, and the gate width was 3 mm.

The resulting substrate was irradiated with ultraviolet rays (184.9 nm, 253.7 nm) using an optical surface processor PL16-110 manufactured by SEN Lights Corp. (optical surface processor power source: UVE-110-1H, high-output low-pressure mercury lamp: SUV110GS-36) for 20 minutes to remove the organic contaminant.

The radiated substrate was then immersed in acetone with a purity of 99% or more and ultrasonically washed for one minute. Then, the substrate was immersed in pure water and ultrasonically washed for one minute. After the washing, the pure water remaining on the surface was blowed away using a nitrogen gas.

A 0.8 wt. % solution of poly(2-vinylnaphthalene) (manufactured by Aldrich Co., weight average molecular weight: 175,000) in toluene was prepared. The previously prepared substrate was coated with the solution by spin coating (forming a film at 3,000 rpm). The film thickness was 22 nm. The coating was baked by heating on a hot plate at 150° C. for five minutes.

Pentacene was formed as a film by vacuum vapor deposition. During the vapor deposition, the previously prepared silicon substrate with the polymer layer formed thereon was heated to 700° C. The film thickness of pentacene was adjusted to 75 nm.

Finally, a protective layer was formed by sealing with silicone grease manufactured by Dow Corning Asia Corp. and a glass substrate. An organic TFT having the structure of FIG. 1D was thus produced (Example 54).

An organic TFT with the structure of FIG. 1C was produced in the same operation as in Example 52, except for changing the formation order of the source/drain electrodes and the polymer layer (Example 55).

Figure 1F:
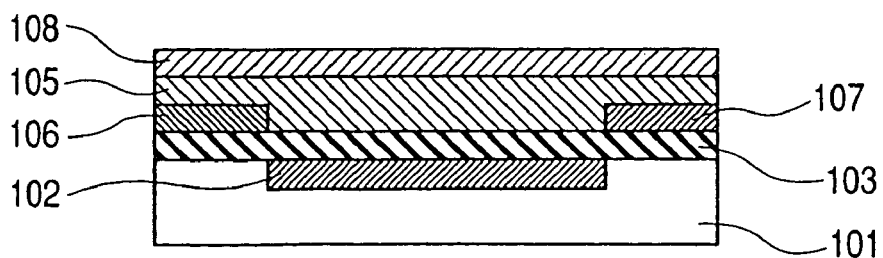
FIG. 1F is a schematically sectional view showing an organic semiconductor device having no polymer layer.

An organic TFT not having a polymer layer as shown in FIG. 1F (Comparative Example 6) was produced in the same manner as in Example 52, except for omitting the operation of forming a polymer layer. The mobility, ON/OFF ratio and gate threshold voltage are shown in Table 9.

The mobility of each of these organic TFTs was calculated by the calculating formula (1) using an HP parameter analyzer (HP4156C). The mobility, ON/OFF ratio and gate threshold voltage are shown in Table 9.

The organic TFTs having a polymer layer had advantages in performance such as a high mobility and/or a high ON/OFF ratio.

TABLE 9

| | Structure of organic semiconductor device | Polymer layer | Mobility | ON/OFF ratio | Gate threshold voltage |
|---|---|---|---|---|---|
| Example | | | | | |
| 54 | FIG. 1D type | Poly(2-vinylnaphthalene) | 0.21 cm$^2$/Vs | $2.0 \times 10^4$ | −29 V |
| 55 | FIG. 1C type | Poly(2-vinylnaphthalene) | 0.45 cm$^2$/Vs | $1.2 \times 10^6$ | −17 V |
| Comparative Example | | | | | |
| 6 | FIG. 1F | None | 0.27 cm$^2$/Vs | $4.7 \times 10^2$ | −12 V |

INDUSTRIAL APPLICABILITY

The present invention provides an organic semiconductor device, which can be produced uniformly on a substrate with a large area, having a high mobility and capable of modulating the drain current significantly by the voltage applied to a gate electrode.

The present invention also provides an organic semiconductor device that is operated in a stable manner, can be driven at a low voltage, has a long life expectancy, and can be produced in a simple process.

The present invention further provides an active matrix display apparatus using the organic semiconductor device or an organic semiconductor apparatus using the organic semiconductor device as an IC card electronic tag.

This application claims priority from Japanese Patent Application Nos. 2003-351159 filed Oct. 9, 2003 and 2004-264499 filed Sep. 10, 2004, which are hereby incorporated by reference herein.

The invention claimed is:

1. An organic semiconductor device comprising a gate electrode, a gate insulating layer, a polymer layer, an organic semiconductor layer, a source electrode, and a drain electrode, wherein the polymer layer is disposed between the gate insulating layer and the organic semiconductor layer, wherein the organic semiconductor layer is provided in contact with the polymer layer and is pentacene, and wherein the polymer layer is poly[2-(4-biphenyl)propene].

2. An active matrix display apparatus comprising the organic semiconductor device set forth in claim 1.

3. An IC card electronic tag comprising the organic semiconductor device set forth in claim 1.

* * * * *